(12) United States Patent
Mori

(10) Patent No.: US 9,933,499 B2
(45) Date of Patent: Apr. 3, 2018

(54) MAGNETIC RESONANCE IMAGING APPARATUS

(71) Applicant: TOSHIBA MEDICAL SYSTEMS CORPORATION, Otawara-shi (JP)

(72) Inventor: Akio Mori, Tochigi (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 520 days.

(21) Appl. No.: 14/570,956

(22) Filed: Dec. 15, 2014

(65) Prior Publication Data

US 2015/0177340 A1 Jun. 25, 2015

(30) Foreign Application Priority Data

Dec. 25, 2013 (JP) .................................. 2013-267586

(51) Int. Cl.
*G01V 3/00* (2006.01)
*G01R 33/36* (2006.01)
(Continued)

(52) U.S. Cl.
CPC ..... *G01R 33/3621* (2013.01); *G01R 33/3664* (2013.01); *G01R 33/3415* (2013.01); *G01R 33/546* (2013.01)

(58) Field of Classification Search
CPC ................................................ G01R 33/3664
(Continued)

(56) References Cited

U.S. PATENT DOCUMENTS 5,086,275 A * 2/1992 Roemer ................. G01R 33/56
324/309
5,160,891 A * 11/1992 Keren ................ G01R 33/3678
324/318
(Continued)

FOREIGN PATENT DOCUMENTS

JP 2009-518098 5/2009
JP 2010-029644 2/2010
(Continued)

OTHER PUBLICATIONS

Japanese office action dated Sep. 26, 2017, in Patent Application No. JP 2013-267586.

*Primary Examiner* — Louis Arana
(74) *Attorney, Agent, or Firm* — Nixon & Vanderhye P.C.

(57) ABSTRACT

A magnetic resonance imaging apparatus according to an embodiment includes a plurality of receiving coils, a couch, a conversion unit, a selection unit, and a reconstruction unit. The receiving coils receive magnetic resonance signals emitted from a subject. The couch includes coil ports connected to the respective receiving coils. The conversion unit is provided on the respective coil ports and converts the magnetic resonance signals that are output from the respective receiving coils to digital signals so as to generate pieces of magnetic resonance data. The selection unit selects pieces of magnetic resonance data to be used for reconstruction among the pieces of magnetic resonance data for the channels that have been output from the receiving coils and converted to the digital signals. The reconstruction unit reconstructs image data using the pieces of magnetic resonance data selected by the selection unit.

16 Claims, 12 Drawing Sheets

(51) Int. Cl.
G01R 33/3415 (2006.01)
G01R 33/54 (2006.01)

(58) Field of Classification Search
USPC .................................... 324/322, 318, 314
See application file for complete search history.

(56) References Cited

U.S. PATENT DOCUMENTS

| | | | | |
|---|---|---|---|---|
| 6,977,502 | B1* | 12/2005 | Hertz | G01R 33/3621 |
| | | | | 324/318 |
| 7,026,818 | B2* | 4/2006 | Machida | G01R 33/3415 |
| | | | | 324/309 |
| 7,619,415 | B2* | 11/2009 | Nakabayashi | G01R 33/34046 |
| | | | | 324/318 |
| 2008/0309341 | A1 | 12/2008 | Dooms et al. | |
| 2011/0103668 | A1 | 5/2011 | Uchizono et al. | |

FOREIGN PATENT DOCUMENTS

| | | |
|---|---|---|
| JP | 2011-115561 | 6/2011 |
| JP | 2012-081013 | 4/2012 |

\* cited by examiner

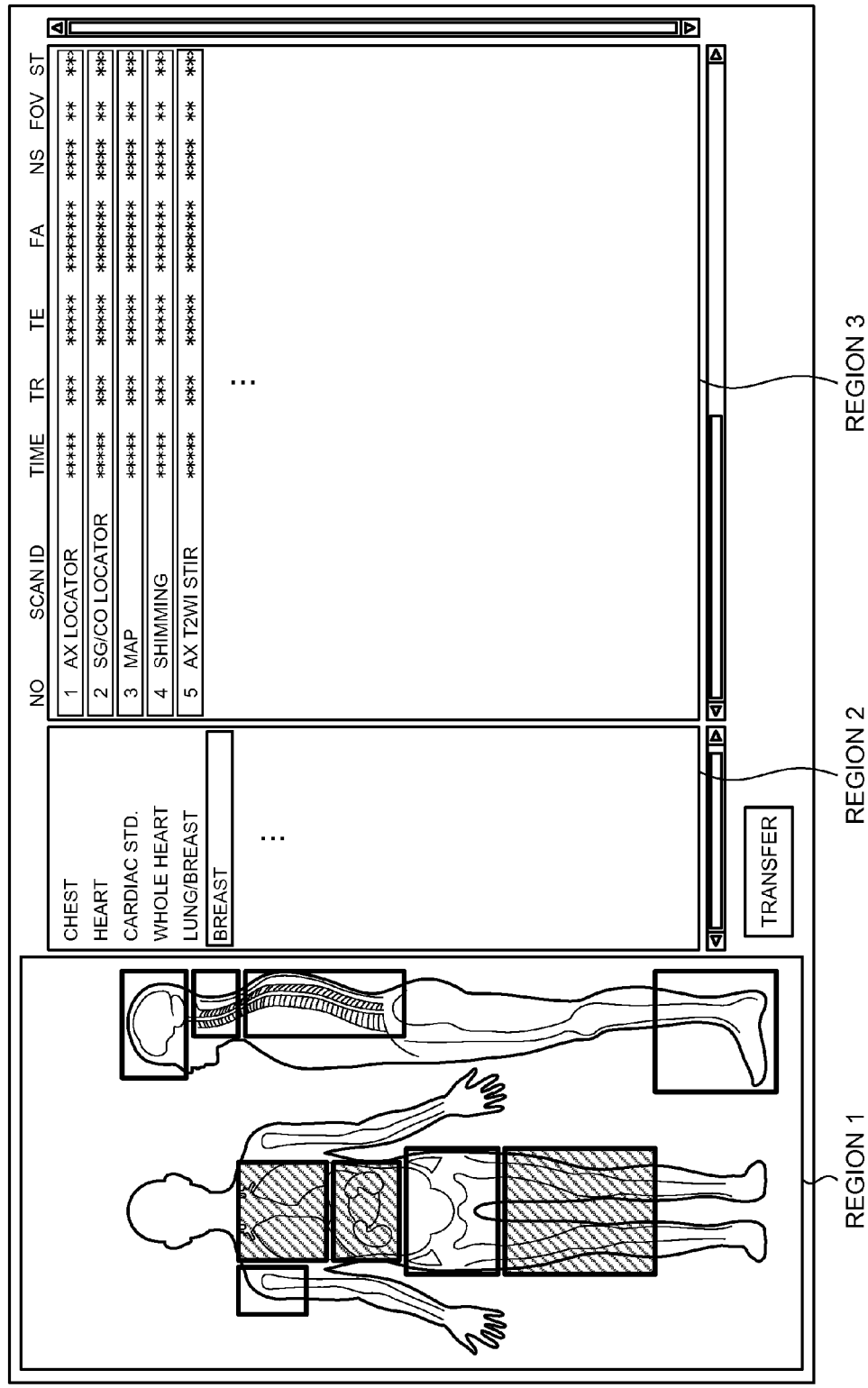

FIG.6

| SITE | COIL ELEMENT |
|---|---|
| HEAD PORTION (PITUITARY GLAND) | HEAD PORTION 1ch, HEAD PORTION 2ch, HEAD PORTION 3ch, ···, HEAD PORTION 8ch |
| ⋮ | ⋮ |
| PECTORAL PORTION (LUNG/BREAST) | PECTORAL PORTION 1ch, PECTORAL PORTION 2ch, PECTORAL PORTION 3ch, ···, PECTORAL PORTION 8ch |
| PECTORAL PORTION (BREAST) | PECTORAL PORTION 1ch, PECTORAL PORTION 2ch, PECTORAL PORTION 3ch, ···, PECTORAL PORTION 8ch |
| ⋮ | ⋮ |
| ABDOMINAL PORTION (LIVER) | ABDOMINAL PORTION 1ch, ABDOMINAL PORTION 2ch, ABDOMINAL PORTION 3ch, ···, ABDOMINAL PORTION 8ch |
| ABDOMINAL PORTION (PANCREAS) | ABDOMINAL PORTION 11ch, ABDOMINAL PORTION 12ch, ABDOMINAL PORTION 13ch, ···, ABDOMINAL PORTION 18ch |
| ⋮ | ⋮ |
| LOWER LIMB PORTION (KNEE JOINT) | LOWER LIMB PORTION 1ch, LOWER LIMB PORTION 2ch, LOWER LIMB PORTION 3ch, ···, LOWER LIMB PORTION 8ch |
| ⋮ | ⋮ |

FIG.7

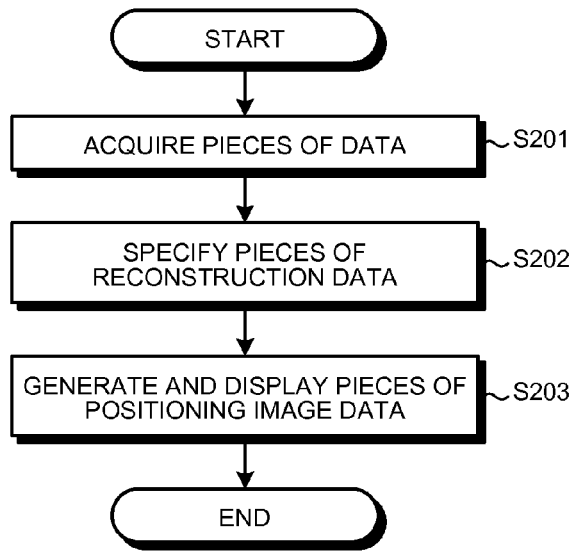

MAGNETIC RESONANCE IMAGING APPARATUS

CROSS-REFERENCE TO RELATED APPLICATIONS

This application is based upon and claims the benefit of priority from Japanese Patent Application No. 2013-267586, filed on Dec. 25, 2013; the entire contents of which are incorporated herein by reference.

FIELD

Embodiments described herein relate generally to a magnetic resonance imaging apparatus.

BACKGROUND

Conventionally, magnetic resonance imaging apparatuses include a receiving coil that receives a magnetic resonance signal emitted from a subject and a receiving unit that converts the magnetic resonance signal output from the receiving coil to a digital signal so as to generate magnetic resonance data. In recent years, in such a configuration, conversion of the magnetic resonance signal received by the receiving coil to the digital signal at a stage as early as possible has been studied in order to prevent noise from being mixed into the magnetic resonance signal.

BRIEF DESCRIPTION OF THE DRAWINGS

FIG. 5 is a diagram for explaining an image capturing condition selection screen in the first embodiment;

FIG. 6 is a diagram illustrating an example of a data structure stored in coil element information in the first embodiment;

FIG. 7 is a flowchart illustrating procedures of pre-scan processing by the MRI apparatus in the first embodiment;

DETAILED DESCRIPTION

Magnetic resonance imaging apparatuses according to embodiments include a plurality of receiving coils, a couch, a conversion unit, a selection unit, and a reconstruction unit. The receiving coils receive magnetic resonance signals that are emitted from a subject. Coil ports that are connected to the respective receiving coils are provided on the couch. The conversion unit is provided on the respective coil ports and converts the magnetic resonance signals that are output from the respective receiving coils to digital signals so as to generate pieces of magnetic resonance data. The selection unit selects pieces of magnetic resonance data to be used for reconstruction among the pieces of magnetic resonance data for the channels that have been output from the receiving coils and converted to the digital signals. The reconstruction unit reconstructs image data using the pieces of magnetic resonance data selected by the selection unit.

Hereinafter, magnetic resonance imaging apparatuses (hereinafter, referred to as "MRI apparatuses" appropriately) according to embodiments will be described with reference to the drawings. It should be noted that the embodiments are not limited to the following embodiments. Contents that will be described in the embodiments can be also applied to other embodiments in the same manner in principle.

First Embodiment

Figure 1:
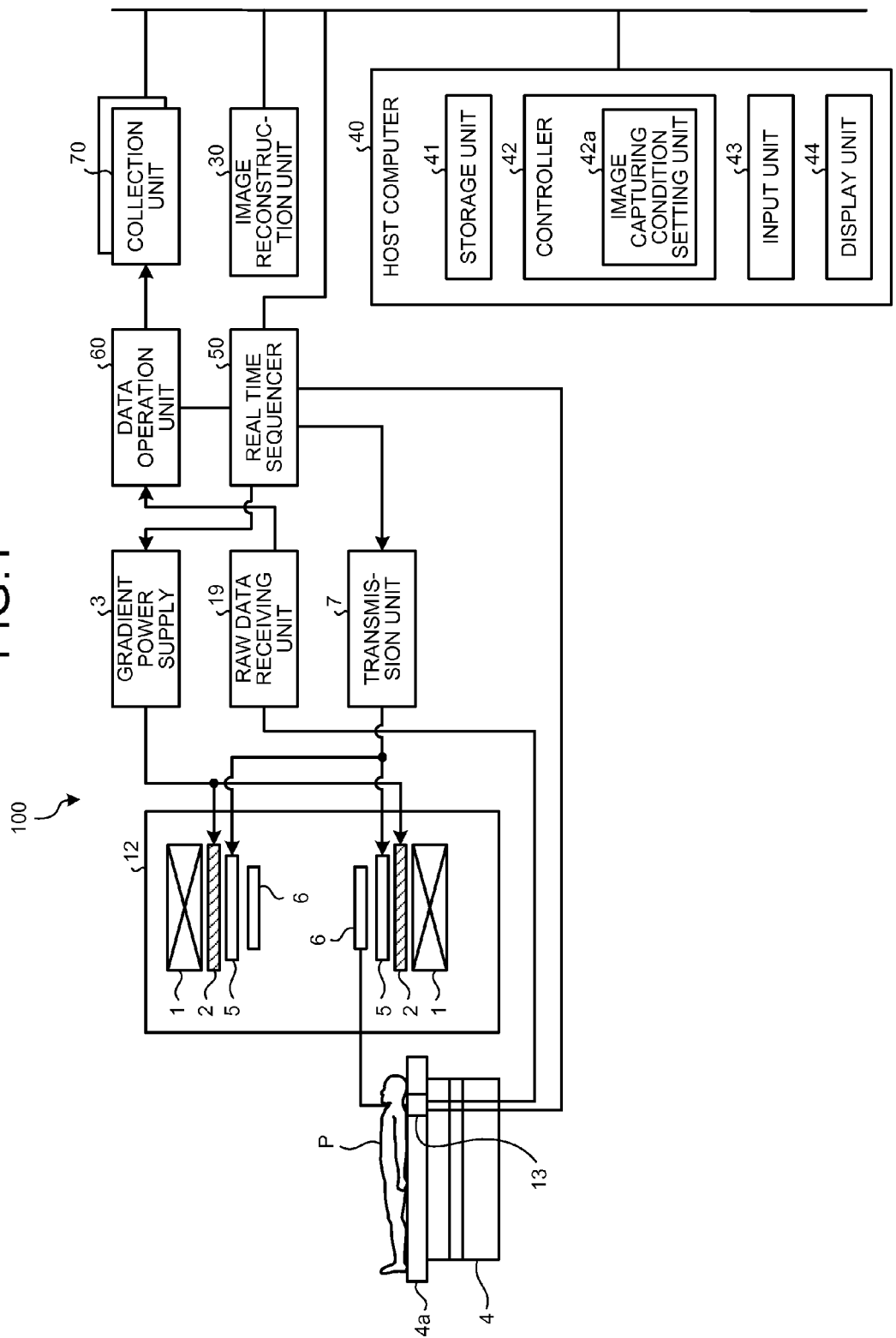
FIG. 1 is a block diagram illustrating an example of the configuration of an MRI apparatus according to a first embodiment.

FIG. 1 is a block diagram illustrating an example of the configuration of an MRI apparatus 100 according to a first embodiment. As illustrated in FIG. 1, the MRI apparatus 100 includes a static magnetic field magnet 1, a gradient coil 2, a gradient power supply 3, a couch 4, transmission coils 5, receiving coils 6, a transmission unit 7, a raw data receiving unit 19, an image reconstruction unit 30, a host computer 40, a real time sequencer 50, a data operation unit 60, and a collection unit 70. It should be noted that the MRI apparatus 100 does not include a subject P (for example, human body). The configuration illustrated in FIG. 1 is merely an example.

The static magnetic field magnet 1 is a hollow cylinder and generates a uniform static magnetic field in an internal space thereof. For example, the static magnetic field magnet 1 is formed by a permanent magnet or a superconductive magnet. The gradient coil 2 is a hollow cylinder and generates a gradient magnetic field in an internal space thereof. To be specific, the gradient coil 2 is arranged at the inner side of the static magnetic field magnet 1 and receives supply of an electric current from the gradient power supply 3 so as to generate the gradient magnetic field. The gradient power supply 3 supplies the electric current to the gradient coil 2 in accordance with pulse sequence execution data that is transmitted from the real time sequencer 50. It should be noted that the static magnetic field magnet 1 and the gradient coil 2 are supported by a mount portion 12.

Figure 2:
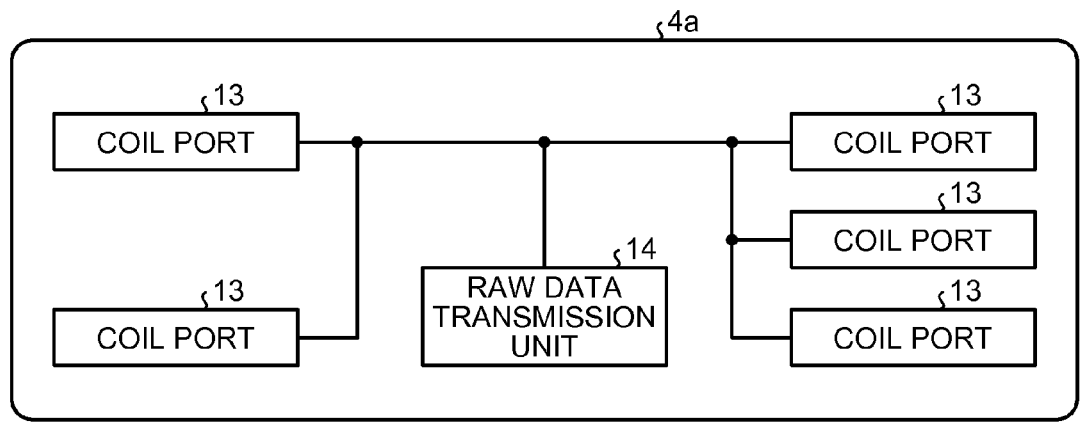
FIG. 2 is a diagram illustrating an arrangement example of coil ports in the first embodiment.

The couch 4 includes a couchtop 4a on which the subject P is placed. In a state where the subject P is placed on the couchtop 4a, the couchtop 4a is inserted into a cavity (image capturing port) of the gradient coil 2. In general, the couch 4 is disposed such that the lengthwise direction thereof is parallel to the central axis of the static magnetic field magnet 1. The couch 4 includes coil ports 13 that are connected to the receiving coils 6. In other words, the coil ports 13 that are connected to the respective receiving coils 6 are provided on the couch 4. FIG. 2 is a diagram illustrating an arrangement example of the coil ports 13 in the first embodiment. FIG. 2 schematically illustrates the arrangement of the coil ports 13 on the couchtop 4a. Practically, the coil ports 13 are arranged on the couchtop 4a so as not to interfere a region on which the subject P is placed.

As illustrated in FIG. 2, for example, the coil ports 13 are arranged on the couchtop 4a included in the couch 4 in the vicinity of end portions thereof in the lengthwise direction. Although two coil ports 13 are provided in the vicinity of one end portion of the couchtop 4a and three coil ports 13 are provided in the vicinity of the other end portion thereof in FIG. 2, the positions and the number of coil ports 13 are not limited thereto. A raw data transmission unit 14 that is connected to each of the coil ports 13 is arranged on the couchtop 4a. The raw data transmission unit 14 will be described in detail later.

Referring back to FIG. 1, the transmission coils 5 generate a high-frequency magnetic field. To be specific, the transmission coils 5 are arranged at the inner side of the gradient coil 2 and receive supply of a high-frequency pulse from the transmission unit 7 so as to generate the high-frequency magnetic field. The transmission unit 7 transmits the high-frequency pulse corresponding to a Larmor frequency to the transmission coils 5 in accordance with the pulse sequence execution data that is transmitted from the real time sequencer 50.

The receiving coils 6 receive magnetic resonance signals that are emitted from the subject P. To be specific, the receiving coils 6 receive the magnetic resonance signals that are emitted from the subject P by an influence of the high-frequency magnetic field. For example, the receiving coils 6 include a receiving coil for a head portion, a receiving coil for a spinal portion, and a receiving coil for an abdominal portion. That is to say, the receiving coils 6 receive the magnetic resonance signals that are emitted from the subject. In the first embodiment, the receiving coils 6 are array coils including a plurality of coil elements and output the magnetic resonance signals received by the respective coil elements through a plurality of channels. The "channels" are units through which a plurality of analog magnetic resonance signals that are output from the respective receiving coils 6 are distributed and synthesized to be output. For example, the number of "channels" is the same as the number of coil elements in the receiving coils 6.

Meanwhile, there have been conventional MRI apparatuses that include analog-to-digital converters (ADCs) for the minimum required number of channels in a receiving unit at a subsequent stage and collect pieces of magnetic resonance data. In the MRI apparatuses, the receiving unit can, however, include only receiving coils for the number that can be connected at the same time and channels the number of which is smaller than that of the receiving coils because the receiving unit is expensive, in general. For coping with this, for example, a selection circuit for selecting 32 channels from 128 channels is provided at a previous stage of the receiving unit, in general. As for the selection circuit, a selection circuit having a different constant in accordance with strength of a magnetic field is required to be prepared and the selection circuit needs to be provided in consideration of isolation of signals between the channels. For these requirements, the selection circuit has large limitations in design. In addition, settings for the selection circuit are complicated and an operator cannot select receivable ports easily.

In order to solve the problems, there has been a conventional method in which ADCs are provided on the receiving coils. The method, however, has the following problems. That is, it is difficult to mount compact ADCs due to limitations in hardware, so that the receiving coils themselves can be increased in size. In addition, interferences between the receiving coils are required to be considered based on varieties of connection states of the receiving coils in design. These disadvantages increase cost of the receiving coils themselves in some cases.

Figure 3:
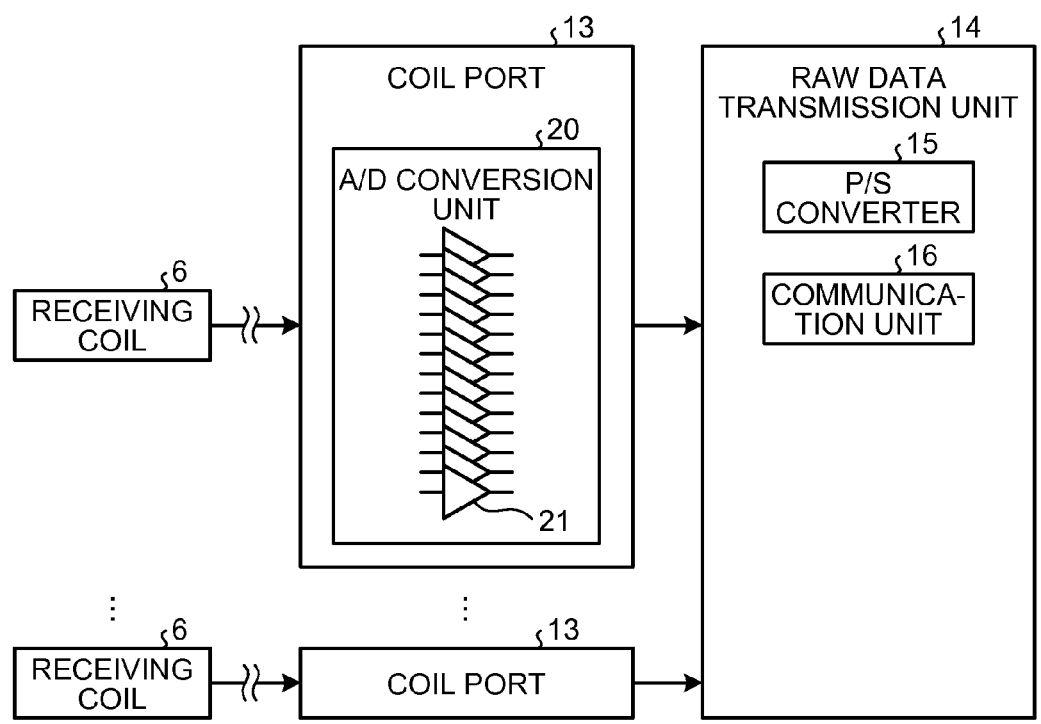
FIG. 3 is a block diagram illustrating an example of the configuration of an A/D conversion unit in the first embodiment.

In contrast, the MRI apparatus 100 in the first embodiment includes A/D conversion unit 20 on the respective coil ports 13. The A/D conversion unit 20 converts the magnetic resonance signals that are output from the receiving coils 6 to digital signals so as to generate pieces of magnetic resonance data. In this case, the receiving coils 6 amplify the received magnetic resonance signals with internal pre-amplifiers and output the amplified magnetic resonance signals to the A/D conversion unit 20. FIG. 3 is a block diagram illustrating an example of the configuration of the A/D conversion unit 20 in the first embodiment.

As illustrated in FIG. 3, the A/D conversion unit 20 is provided on the respective coil ports 13 and converts the magnetic resonance signals that are output from the respective receiving coils 6 to the digital signals so as to generate the pieces of magnetic resonance data. The A/D conversion unit 20 converts the magnetic resonance signals to the digital signals for the respective channels of the receiving coil 6 so as to generate the pieces of magnetic resonance data. The A/D conversion unit 20 then transmits the generated pieces of magnetic resonance data to the raw data transmission unit 14.

To be specific, the A/D conversion unit 20 has a function of converting the magnetic resonance signals to the digital signals so as to generate the pieces of magnetic resonance data with a direct sampling system. The direct sampling system is a signal processing system that analog-to-digital (A/D)-converts an analog signal directly and performs wave detection of it without performing frequency conversion. When direct sampling is executed on the magnetic resonance signal, wave detection of the digital signal is executed using a wave detection carrier of the magnetic resonance signal generated by a direct digital synthesizer (DDS). The DDS is a circuit or a system that generates an arbitrary waveform or frequency digitally.

For example, as illustrated in FIG. 3, the A/D conversion unit 20 includes a plurality of ADCs 21. The ADCs 21 convert the analog magnetic resonance signals that are output from the receiving coils 6 to the digital signals so as to generate the pieces of magnetic resonance data. To be specific, the ADCs 21 are ADCs for the direct sampling system, directly sample the analog magnetic resonance signals that are output from the receiving coils 6, and convert them to the digital signals.

In general, the configuration of the ADCs for the direct sampling system is simplified, so that the integration degree can be enhanced easily and a large number of ADCs can be incorporated in the coil ports 13. With this, the ADCs 21 in the first embodiment for the same number as the number of coil elements included in the receiving coils 6 are provided. In the following description, the number of coil elements included in the receiving coils 6 is assumed to be 128. In this case, when the A/D conversion units 20 provided on the respective coil ports 13 are added together, 128 ADCs 21 are provided. The respective ADCs 21 correspond to the 128 coil elements of the receiving coils 6 in a one-to-one relation and the pieces of magnetic resonance data are transmitted for the respective coil elements. Although the following describes the case where the ADCs 21 for the number corresponding to the number of coil elements are included, the embodiment is not limited thereto. For example, one ADC 21 may process signals from a plurality of coil elements when the sampling speed allows.

The ADCs 21 digitalize the magnetic resonance signals and transmit them as the pieces of magnetic resonance data to the raw data transmission unit 14. All the ADCs 21 included in the A/D conversion units 20 transmit the pieces of magnetic resonance data to the raw data transmission unit 14. For example, when the number of coil elements is 128, the A/D conversion units 20 transmit the pieces of magnetic resonance data for the 128 coil elements to the raw data transmission unit 14. In other words, the A/D conversion units 20 transmit all the pieces of magnetic resonance data to the raw data transmission unit 14 without selecting the magnetic resonance data. This enables the MRI apparatus 100 in the first embodiment to collect the magnetic resonance signals efficiently.

Thus, in the MRI apparatus 100 in the first embodiment, the ADCs 21 are arranged on the coil ports 13 so as to eliminate necessity for provision of the ADCs on the receiving unit at the subsequent stage, thereby simplifying the configuration. Furthermore, in the MRI apparatus 100 in the first embodiment, the ADCs 21 are arranged on the coil ports 13 so as to prevent noise from being mixed into the magnetic resonance signals.

The raw data transmission unit 14 includes a parallel/serial (P/S) converter 15 and a communication unit 16. The raw data transmission unit 14 transmits the pieces of magnetic resonance data for the channels that have been generated by the A/D conversion units 20 to the data operation unit 60 through wireless communication.

The P/S converter 15 converts the pieces of magnetic resonance data from parallel signals to serial signals. To be specific, the P/S converter 15 converts the pieces of magnetic resonance data transmitted from the ADCs 21 from the parallel signals to the serial signals for the respective channels and transmits the converted pieces of magnetic resonance data to the communication unit 16.

The communication unit 16 transmits the pieces of magnetic resonance data converted to the serial signals to the raw data receiving unit 19. It should be noted that the raw data receiving unit 19 delivers the received pieces of magnetic resonance data to the data operation unit 60. The communication unit 16 makes wireless communication with the raw data receiving unit 19.

Referring back to FIG. 1, the real time sequencer 50 is connected to the gradient power supply 3, the transmission unit 7, and the data operation unit 60, and controls input and output of data that is transmitted and received between the individual units connected thereto and the host computer 40. To be specific, the real time sequencer 50 generates the pulse sequence execution data based on sequence information that is determined in accordance with an image capturing condition directed by an operator. That is to say, the real time sequencer 50 analyzes the image capturing condition transmitted from the host computer 40 and generates the pulse sequence execution data. The real time sequencer 50 then controls the gradient power supply 3 and the transmission unit 7 so as to execute a pulse sequence defined in accordance with the image capturing condition based on the pulse sequence execution data.

Furthermore, the real time sequencer 50 receives selection information from the host computer 40 and transmits the selection information to the data operation unit 60. The selection information is information specifying coil elements to be used for reconstruction.

The raw data receiving unit 19 receives the pieces of magnetic resonance data transmitted by the raw data transmission unit 14. The raw data receiving unit 19 delivers the received pieces of magnetic resonance data to the data operation unit 60.

The data operation unit 60 acquires the pieces of magnetic resonance data generated by the A/D conversion units 20 provided on the coil ports 13 from the raw data receiving unit 19. The data operation unit 60 then selects pieces of magnetic resonance data to be used for reconstruction among the pieces of magnetic resonance data for the channels that have been output from the receiving coils 6 and converted to the digital signals by referring to the selection information transmitted from the real time sequencer 50 and transmits the selected pieces of magnetic resonance data to the collection unit 70. In other words, the data operation unit 60 does not transmit the pieces of magnetic resonance data not to be used for reconstruction to the collection unit 70 based on the direction by the host computer 40 before scanning.

The data operation unit 60 has a buffer and can accumulate the pieces of magnetic resonance data for the channels. The data operation unit 60 selects the pieces of magnetic resonance data to be used for reconstruction of images from the pieces of magnetic resonance data for the channels accumulated in the buffer.

Furthermore, the data operation unit 60 rearranges the pieces of magnetic resonance data to be used for reconstruction in the order of slices in the buffer. The details of the data operation unit 60 will be described later. It should be noted that the data operation unit 60 is also referred to as a "selection unit".

The collection unit 70 collects the pieces of magnetic resonance data to be used for reconstruction. For example, when the collection unit 70 acquires the pieces of magnetic resonance data from the data operation unit 60, it performs pieces of correction processing such as averaging processing and phase correction processing on the acquired pieces of magnetic resonance data and transmits the corrected pieces of magnetic resonance data to the image reconstruction unit 30.

The image reconstruction unit 30 performs pieces of image processing such as filtering processing and reconstruction processing on the pieces of magnetic resonance data transmitted from the collection unit 70 so as to generate image data. In other words, the image reconstruction unit 30 reconstructs the image data using the pieces of magnetic resonance data selected by the data operation unit 60. To be specific, the image reconstruction unit 30 performs pieces of image processing such as k space conversion filtering processing, two-dimensional fast fourier transform (FFT) or three-dimensional FFT, and image filtering so as to reconstruct two-dimensional or three-dimensional image data and transmits the reconstructed image data to the host computer 40. The image reconstruction unit 30 reconstructs, as the image data, positioning images based on the pieces of magnetic resonance data obtained by executing pre-scan and reconstructs image data for diagnosis based on the pieces of magnetic resonance data obtained by executing imaging scan.

The host computer 40 includes a storage unit 41, a controller 42, an input unit 43, and a display unit 44. The storage unit 41 stores therein the image data and the like generated by the image reconstruction unit 30. For example, the storage unit 41 is a random access memory (RAM), a semiconductor memory element such as a flash memory, a hard disk, an optical disk, or the like.

The input unit 43 receives various directions and information input from the operator. For example, the input unit 43 is a pointing device such as a mouse and a track ball or an input device such as a keyboard. The display unit 44 displays various pieces of information such as the image data under the control by the controller 42. For example, the display unit 44 is a display device such as a liquid crystal display.

The controller 42 includes a central processing unit (CPU) and controls the units described above so as to control the MRI apparatus 100 overall. For example, the controller 42 controls display by the display unit 44. The controller 42 includes an image capturing condition setting unit 42a.

The image capturing condition setting unit 42a generates sequence information based on the image capturing condition that is input by the operator through the input unit 43 and transmits the generated sequence information to the real time sequencer 50.

The image capturing condition setting unit 42a specifies the pieces of magnetic resonance data to be used for reconstruction based on the image capturing condition received from the operator. For example, the image capturing condition setting unit 42a specifies coil elements to be used for reconstruction based on the image capturing condition input by the operator through the input unit 43 and transmits the specified coil elements as the selection information to the real time sequencer 50. Based on this, the data operation unit 60 selects the pieces of magnetic resonance data specified by the image capturing condition setting unit 42a as the pieces of magnetic resonance data to be used for reconstruction. It should be noted that the image capturing condition setting unit 42a is also referred to as a "specifying unit".

Figure 4:
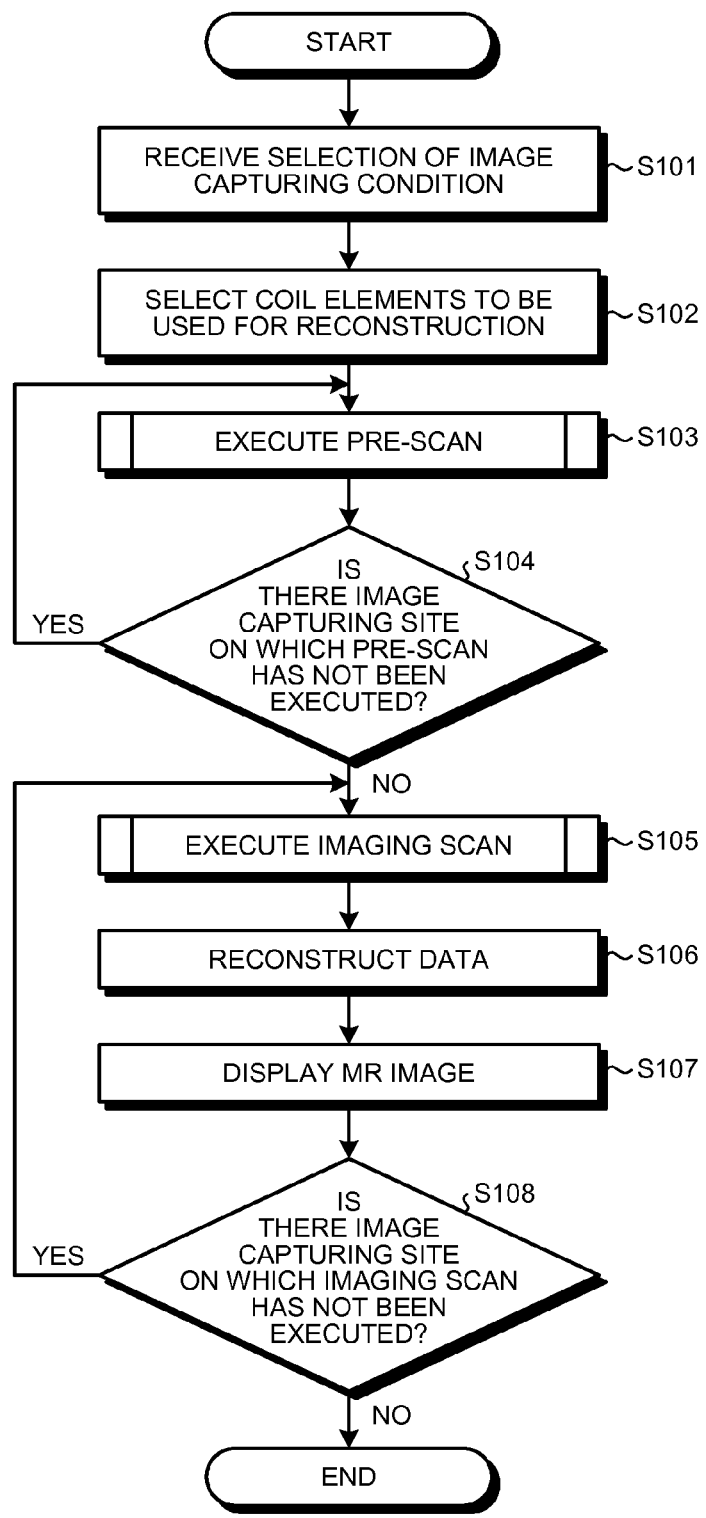
FIG. 4 is a flowchart illustrating procedures of processing by the MRI apparatus in the first embodiment.

Next, processing by the MRI apparatus 100 will be described in detail with reference to FIG. 4. FIG. 4 is a flowchart illustrating procedures of the processing by the MRI apparatus 100 in the first embodiment. In the first embodiment, multi-station image capturing in which a plurality of image capturing sites is set to be targets in one test is supposed, and for example, the case where cross-sectional images of a "pectoral portion", an "abdominal portion", and a "lower limb portion" are captured is described.

As illustrated in FIG. 4, the image capturing condition setting unit 42a displays an image capturing condition selection screen and receives selection of the image capturing condition (step S101). The image capturing condition is a condition that is set for image capturing, and includes an image capturing site, a type of a captured-image cross section, and various image capturing parameters, for example. The captured-image cross section includes an axial cross section, a sagittal cross section, and a coronal cross section. The image capturing parameters include pieces of setting information such as a repetition time (TR), an echo time (TE), a flip angle (FA), the number of slices (NS), a field of view (FOV), and a slice thickness (ST), for example.

FIG. 5 is a diagram for explaining the image capturing condition selection screen in the first embodiment. FIG. 5 illustrates the case where an image capturing condition of the "pectoral portion" is further set after setting the image capturing condition of the "abdominal portion" and the image capturing condition of the "lower limb portion". For example, as illustrated in FIG. 5, the image capturing condition selection screen includes a region 1, a region 2, and a region 3 in this order from the left. Selection of the image capturing site on a human phantom figure is received on the region 1. Names (hereinafter, referred to as "protocol titles" appropriately) of image capturing of various types that are included in a group of the image capturing site selected on the region 1 are displayed on the region 2. A list of scan groups (protocol groups) that can be executed by image capturing of the type selected on the region 2 is displayed on the region 3.

When the image capturing condition setting unit 42a receives selection of the image capturing site on the region 1, it displays, on the region 2, a list of the protocol titles included in the group of the selected image capturing site. For example, when the operator selects a rectangle corresponding to the "pectoral portion" on the region 1, a list of the protocol titles of various types included in the group of the "pectoral portion" is displayed on the region 2.

Subsequently, when the image capturing condition setting unit 42a receives selection of the protocol title on the region 2, it displays, on the region 3, a list of scan groups (protocol groups) included in the selected protocol title. For example, when the operator selects "Breast" on the region 2, a list of the scan groups (protocol groups) that can be executed by image capturing for the corresponding protocol title is displayed on the region 3. The list includes a protocol group relating to pre-scan that is executed before executing image scan and a protocol group relating to the image scan for collecting image data for diagnosis. For example, the protocol group relating to the pre-scan includes a protocol for collecting positioning images, a protocol for collecting sensitivity map data, and a protocol for shimming. Furthermore, the list includes one or a plurality of protocols for image scan of various types.

Subsequently, the image capturing condition setting unit 42a receives selection of one or a plurality of protocols on the region 3. As illustrated in FIG. 5, each protocol includes a "Scan identifier (ID)" corresponding to the name of the protocol, "Time" as the image capturing time of the protocol, and others including TR, TE, FA, NS, FOV, and ST.

The image capturing condition setting unit 42a transmits the selected image capturing condition as the sequence information to the real time sequencer 50.

Referring back to FIG. 4, subsequently, the image capturing condition setting unit 42a selects coil elements to be used for reconstruction (step S102). For example, the image capturing condition setting unit 42a selects the coil elements to be used for reconstruction based on the coil element information in which the image capturing sites and the coil elements are made to correspond to each other. It should be noted that the storage unit 41 stores therein the coil element information.

FIG. 6 is a diagram illustrating an example of a data structure stored in the coil element information in the first embodiment. As illustrated in FIG. 6, as the coil element information, information in which the "site" and the "coil element" are made to correspond to each other is stored. The "site" indicates the image capturing site specified by the protocol titles illustrated in FIG. 5. The "coil element" indicates coil elements to be used for reconstruction of image data on the image capturing site among the coil elements receiving the magnetic resonance signals. The image capturing condition setting unit 42a specifies the coil elements to be used for reconstruction for each image capturing site from the coil element information. In the example illustrated in FIG. 6, for example, when the image capturing site is a "pectoral portion (Breast)", the image capturing condition setting unit 42a specifies a pectoral portion 1ch to a pectoral portion 8ch as the coil elements to be used for reconstruction. For example, when the image capturing site is an "abdominal portion (liver)", the image capturing condition setting unit 42a specifies an abdominal portion 1ch to an abdominal portion 8ch as the coil elements to be used for reconstruction. The image capturing condition setting unit 42a transmits the specified coil elements as the selection information to the real time sequencer 50. With this, the real time sequencer 50 transmits the selection information to the data operation unit 60, so that the data operation unit 60 can specify the pieces of magnetic resonance data to be used for reconstruction.

The real time sequencer 50 then specifies any one site on which pre-scan is not executed among the sites specified by the image capturing condition based on the sequence information transmitted from the image capturing condition setting unit 42a, generates pulse sequence execution data for the specified site, and executes the pre-scan (step S103). For example, the real time sequencer 50 in the first embodiment collects the positioning images and collects the sensitivity map data indicating sensitivity distribution of the coil elements as one pre-scan. FIG. 7 is a flowchart illustrating procedures of pre-scan processing by the MRI apparatus 100 in the first embodiment. In FIG. 7, the positioning images are assumed to be generated as the pre-scan.

As illustrated in FIG. 7, the data operation unit 60 acquires the pieces of magnetic resonance data generated by the A/D conversion units 20 from the raw data receiving unit 19 (step S201). The data operation unit 60 acquires the pieces of magnetic resonance data obtained by digitalizing the magnetic resonance signals received by the 128 coil elements. The data operation unit 60 then specifies the pieces of magnetic resonance data to be used for reconstruction by referring to the selection information transmitted from the real time sequencer 50 (step S202). The data operation unit 60 specifies the pieces of magnetic resonance data to be used for reconstruction for the image capturing site specified at step S103. The data operation unit 60 transmits the specified pieces of data to the collection unit 70. Thus, the data operation unit 60 can acquire the pieces of magnetic resonance data received by the 128 coil elements included in the receiving coils 6, and transmits only the pieces of magnetic resonance data to be used for reconstruction among the acquired pieces of magnetic resonance data to the collection unit. The pieces of magnetic resonance data that have not been selected as the pieces of magnetic resonance data to be used for reconstruction are rewritten by acquiring the pieces of magnetic resonance data newly in the pre-scan. That is to say, in the pre-scan, the pieces of magnetic resonance data that have not been selected as the pieces of magnetic resonance data to be used for reconstruction are treated as if they are discarded.

Subsequently, the image reconstruction unit 30 acquires the pieces of magnetic resonance data from the collection unit 70, generates the pieces of positioning image data, and displays them on the display unit 44 (step S203). The operator then refers to the positioning images, so that the image capturing condition setting unit 42a receives setting of the image capturing region for the imaging scan and setting of the image capturing parameters from the operator.

Referring back to FIG. 4, the real time sequencer 50 executes the pre-scan on one site, and then, determines whether there is an image capturing site on which the pre-scan has not been executed (step S104). When the real time sequencer 50 determines that there is the image capturing site on which the pre-scan has not been executed (Yes at step S104), the process advances to step S103, and the real time sequencer 50 specifies any one site on which the pre-scan has not been executed among the sites set with the image capturing condition, and executes the pre-scan on the specified site.

Figure 8:
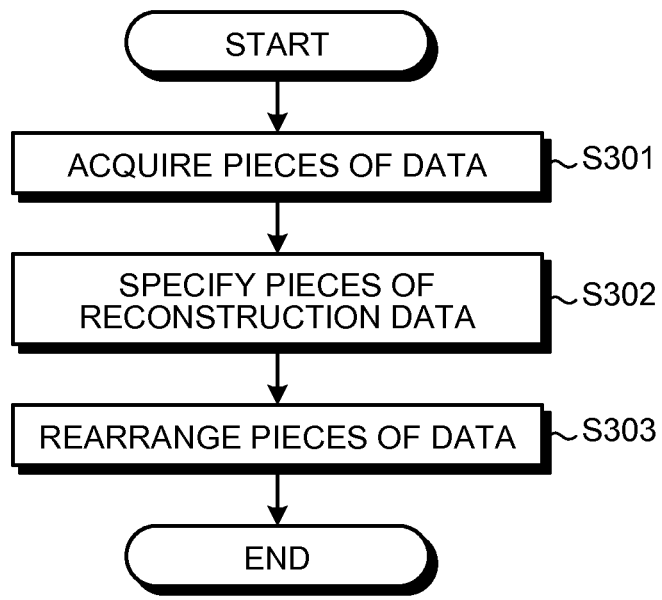
FIG. 8 is a flowchart illustrating procedures of imaging scan processing by the MRI apparatus in the first embodiment.

On the other hand, when the real time sequencer 50 determines that there is no image capturing site on which the pre-scan has not been executed (No at step S104), it specifies any one site on which the imaging scan has not been executed among the sites set with the image capturing condition, and executes the imaging scan for collecting image data for diagnosis (step S105). The real time sequencer 50 specifies any one site on which the imaging scan has not been executed among the sites set with the image capturing condition based on the sequence information transmitted from the image capturing condition setting unit 42a. The real time sequencer 50 then generates pulse sequence execution data for the specified site, and executes the imaging scan. FIG. 8 is a flowchart illustrating the procedures of the imaging scan processing by the MRI apparatus 100 in the first embodiment.

The data operation unit 60 acquires the pieces of magnetic resonance data generated by the A/D conversion units 20 from the raw data receiving unit 19 (step S301). The data operation unit 60 acquires the pieces of magnetic resonance data obtained by digitalizing the magnetic resonance signals received by the 128 coil elements. The data operation unit 60 then specifies the pieces of magnetic resonance data to be used for reconstruction by referring to the selection information transmitted from the real time sequencer 50 (step S302). The data operation unit 60 specifies the pieces of magnetic resonance data to be used for reconstruction for the image capturing site specified at step S105. The pieces of magnetic resonance data that have not been selected as the pieces of magnetic resonance data to be used for reconstruction are rewritten by acquiring the pieces of magnetic resonance data newly in the imaging scan. That is to say, in the imaging scan, the pieces of magnetic resonance data that have not been selected as the pieces of magnetic resonance data to be used for reconstruction are treated as if they are discarded.

Figure 9:
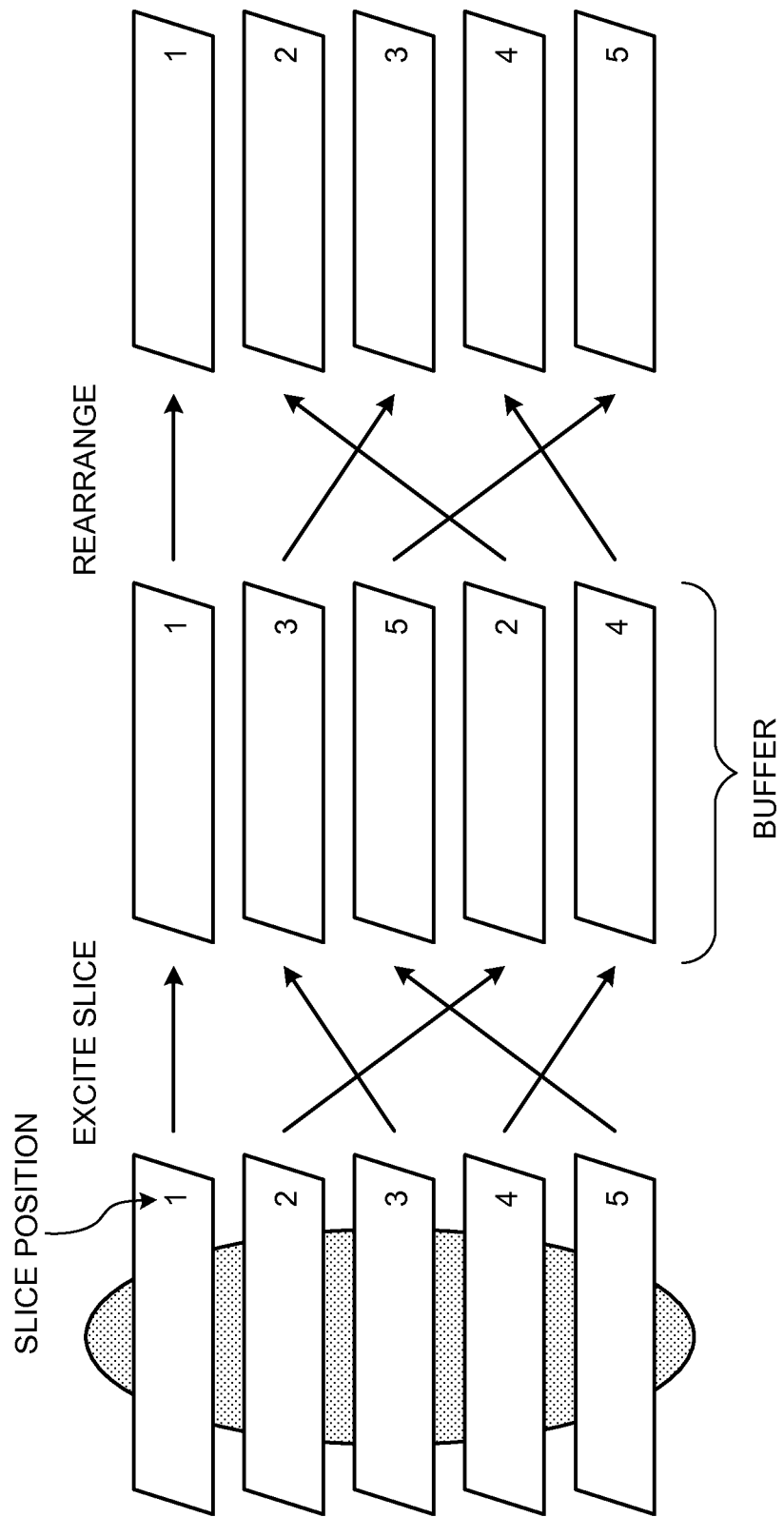
FIG. 9 is a diagram for explaining rearrangement of pieces of magnetic resonance data by a data operation unit in the first embodiment.

The data operation unit 60 rearranges the pieces of magnetic resonance data (step S303). FIG. 9 is a diagram for explaining rearrangement of the pieces of magnetic resonance data by the data operation unit 60 in the first embodiment. The case where an image capturing target is formed by five slices is explained with reference to FIG. 9. In the example illustrated in FIG. 9, magnetic resonance data the slice position of which is "1" is excited first, magnetic resonance data the slice position of which is "3" is excited second, magnetic resonance data the slice position of which is "5" is excited third, magnetic resonance data the slice position of which is "2" is excited fourth, and magnetic resonance data the slice position of which is "4" is excited fifth.

When the pieces of magnetic resonance data are reconstructed in the excitation order illustrated in FIG. 9, image data are generated in the order of excitation. For this reason, the image reconstruction unit 30 rearranges the image data when the image data are reconstructed. This processing of rearranging the image data involves access to disc, resulting in the lowering of the reconstruction processing speed. For coping with this, the data operation unit 60 rearranges the pieces of magnetic resonance data in the buffer such that the image data are generated in the order of the slice positions. In the example illustrated in FIG. 9, the data operation unit 60 rearranges the pieces of magnetic resonance data in the buffer such that the magnetic resonance data the slice position of which is "1", the magnetic resonance data the slice position of which is "2", the magnetic resonance data the slice position of which is "3", the magnetic resonance data the slice position of which is "4", and the magnetic resonance data the slice position of which is "5" are rearranged in this order. The data operation unit 60 then transmits the rearranged pieces of magnetic resonance data to the collection unit 70.

Referring back to FIG. 4, the image reconstruction unit 30 reconstructs data (step S106). The image reconstruction unit 30 can increase the speed of the reconstruction processing because the data are rearranged in the order of slices. The pieces of data reconstructed by the image reconstruction unit 30 are added with IDs in a unique format or IDs in a digital imaging and communication in medicine (DICOM) format and are stored in the storage unit 41 of the host computer 40. Thereafter, the controller 42 reads the image data stored in the storage unit 41 and causes the display unit 44 to display them (step S107). The real time sequencer 50 executes the imaging scan on one site, and then, determines whether there is an image capturing site on which the imaging scan has not been executed (step S108). When the real time sequencer 50 determines that there is the image capturing site on which the imaging scan has not been executed (Yes at step S108), the process advances to step S105, and the real time sequencer 50 executes the imaging scan on any one site on which the imaging scan has not been executed among the sites set with the image capturing condition.

On the other hand, when the real time sequencer 50 determines that there is no image capturing site on which the imaging scan has not been executed (No at step S108), the processing is finished.

As described above, in the first embodiment, the A/D conversion unit 20 that converts the magnetic resonance signals output from the receiving coils 6 to the digital signals so as to generate the pieces of magnetic resonance data is provided on the coil ports 13 of the couch 4. Thus, the A/D conversion unit 20 is provided on the coil ports 13 of the couch 4, so that the magnetic resonance signals output from the receiving coils 6 are A/D-converted at a time point at which the magnetic resonance signals are input to the coil ports 13. With this configuration, the magnetic resonance signals are digitalized at an early stage on a path from the receiving coils 6 to the collection unit 70, thereby preventing noise from being mixed into the magnetic resonance signals.

Furthermore, as described above, in the first embodiment, the manufacturing cost of the apparatus can be reduced by using inexpensive ADCs for the direct sampling system. As described above, in general, the configuration of the ADCs for the direct sampling system is simplified so as to enhance the integration degree easily, thereby incorporating a large number of ADCs into the coil ports 13.

Figure 10:
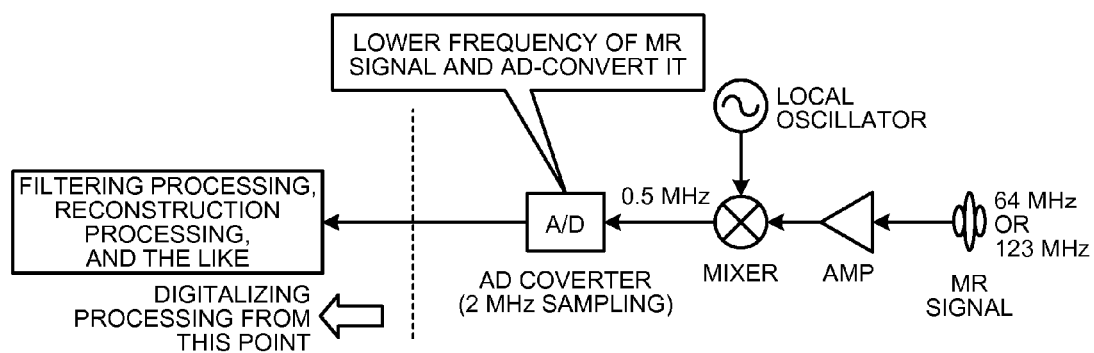
FIG. 10 is a diagram illustrating an example of a receiving circuit using a conventional ADC.

FIG. 10 is a diagram illustrating an example of a receiving circuit using a conventional ADC. As illustrated in FIG. 10, for example, in the configuration using the conventional ADC, a high-frequency amplifier (AMP) amplifies a magnetic resonance (MR) signal received by a receiving coil, a local oscillator and a mixer lower the frequency thereof, and the ADC performs A/D conversion in this order. This receiving circuit is therefore increased in the circuit size and it is difficult to mount it on the couch.

Figure 11:
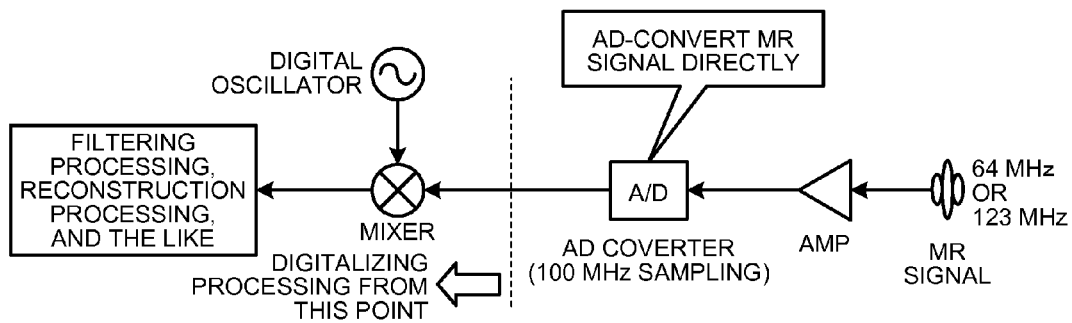
FIG. 11 is a diagram illustrating the configuration of a receiving circuit using an ADC for direct sampling in the first embodiment.

FIG. 11 is a diagram illustrating the configuration of a receiving circuit using the ADC for the direct sampling in the first embodiment. As illustrated in FIG. 11, for example, in the first embodiment, a high-frequency amplifier (AMP) amplifies a magnetic resonance (MR) signal received by a receiving coil, and then, the ADC for the direct sampling system is used to sample the magnetic resonance signal directly and perform A/D conversion on it. Thus, the configuration using the ADC for the direct sampling system is reduced in the circuit size in comparison with the configuration using the conventional ADC. This enables the ADCs for the channels to be mounted thereon easily. In the example illustrated in FIG. 11, the ADC digitalizes the magnetic resonance signal, and then, a digital oscillator and a mixer perform thinning processing. The thinning processing and decimation can be performed easily on the magnetic resonance signal after the digitalization.

As described above, in the first embodiment, the magnetic resonance signals are digitalized in the coil ports 13, so that compatibility with the existing coil having no ADC is kept. Furthermore, the magnetic resonance signals are digitalized in the couch 4 and wireless communication is made between the couch 4 and the raw data receiving unit 19. With this configuration, a detachable dockable couch capable of moving a patient while he (she) is lying is easy to be configured.

Moreover, as described above, in the first embodiment, the pieces of magnetic resonance data to be used for reconstruction are selected so as to reduce the processing load to reconstruct the image data. In addition, as described above, in the first embodiment, the pieces of magnetic resonance data are rearranged in the order of slices so as to further optimize the reconstruction processing of the image data.

Figure 12:
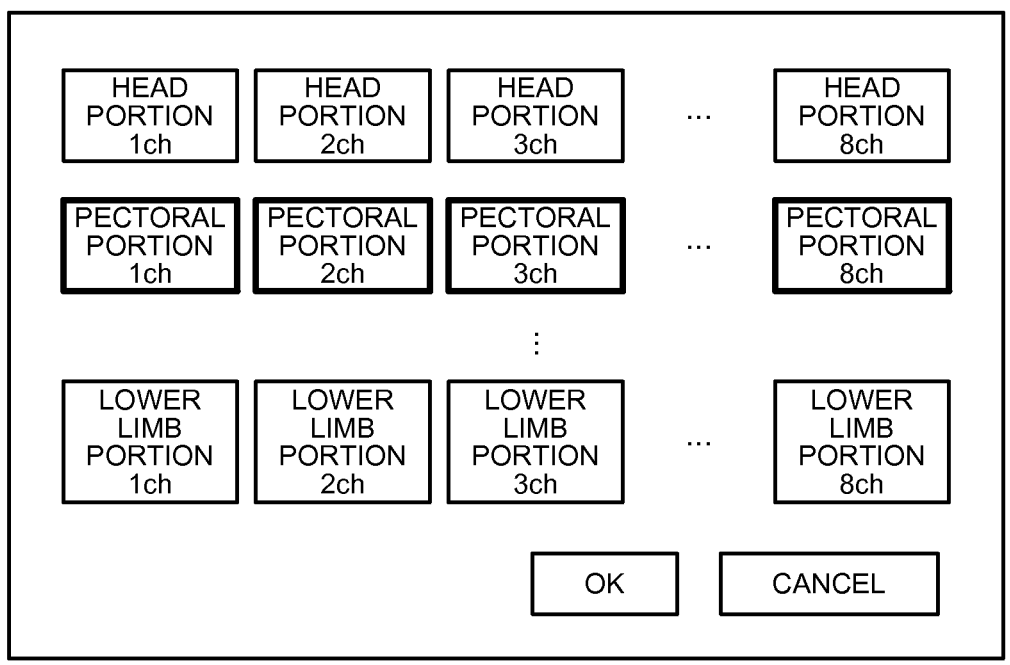
FIG. 12 is a diagram for explaining a coil element selection screen for reconstruction according to a modification of the first embodiment.

Although the image capturing condition setting unit 42*a* specifies the coil elements to be used for reconstruction based on the image capturing site in the above-mentioned embodiment, the embodiment is not limited thereto. For example, the image capturing condition setting unit 42*a* may receive a direction on the coil elements to be used for reconstruction from the operator. In other words, the image capturing condition setting unit 42*a* may receive a direction on the pieces of magnetic resonance data to be used for reconstruction from the operator. FIG. 12 is a diagram for explaining a coil element selection screen for reconstruction according to a modification of the first embodiment. FIG. 12 illustrates a part of coil elements that can be selected as the coil elements to be used for reconstruction in the MRI apparatus 100.

On the coil element selection screen for reconstruction illustrated in FIG. 12, the image capturing condition setting unit 42*a* specifies coil elements selected by a touch operation by the operator as the coil elements to be used for reconstruction. In FIG. 12, the coil elements selected by the operator are surrounded by thick frames. In the example illustrated in FIG. 12, the image capturing condition setting unit 42*a* specifies a "pectoral portion 1*ch*" to a "pectoral portion 8*ch*" as the coil elements to be used for reconstruction. The image capturing condition setting unit 42*a* then transmits the specified coil elements as the selection information to the real time sequencer 50. This causes the data operation unit 60 to select the pieces of magnetic resonance data received by the image capturing condition setting unit 42*a* as the pieces of magnetic resonance data to be used for reconstruction. It should be noted that the image capturing condition setting unit 42*a* is also referred to as a "receiver".

Furthermore, the coil element information is not limited to the example illustrated in FIG. 6. For example, the individual sites may be further divided into a plurality of regions and coil elements corresponding to the respective divided regions may be stored in the coil element information. This enables the pieces of magnetic resonance data to be used for reconstruction to be set in more detail. In the same manner, the coil element selection screen for reconstruction is not limited to the example illustrated in FIG. 12, and the individual sites may be further divided into a plurality of regions and selection of the coil elements may be made receivable for the respective divided regions.

Although in the pre-scan and the imaging scan, the pieces of magnetic resonance data that have not been selected as the pieces of magnetic resonance data to be used for reconstruction are treated as if they are discarded in the above-mentioned embodiment, the embodiment is not limited thereto. For example, the MRI apparatus 100 may hold the pieces of magnetic resonance data that have not been selected as the pieces of magnetic resonance data to be used for reconstruction temporarily. In such a case, the MRI apparatus 100 may receive a request to reconstruct the image data that have not been set as the image capturing condition after displaying the image data set as the image capturing condition. To be more specific, when the "pectoral portion", the "abdominal portion", and the "lower limb portion" are set as the image capturing condition, the MRI apparatus 100 collects 128 pieces of magnetic resonance data in each imaging scan of the "pectoral portion", "abdominal portion", and the "lower limb portion". The MRI apparatus 100 holds all the collected pieces of magnetic resonance data temporarily.

The MRI apparatus 100 then receives reconstruction of the image data of the sites that have not been set as the image capturing condition after reconstructing and displaying the image data on the "pectoral portion", the "abdominal portion", and the "lower limb portion". For example, the MRI apparatus 100 receives a request to reconstruct image data of a "pelvic portion". Subsequently, the MRI apparatus 100 specifies pieces of magnetic resonance data corresponding to the "pelvic portion" from the pieces of magnetic resonance data collected by the imaging scan of the "abdominal portion" or the "lower limb portion", for example, as sites adjacent to the "pelvic portion" among the held pieces of magnetic resonance data. The MRI apparatus 100 then reconstructs the image data of the "pelvic portion" using the specified pieces of magnetic resonance data.

Furthermore, although the A/D conversion unit 20 is provided on the coil ports 13 in the above-mentioned embodiment, the embodiment is not limited thereto. For example, the A/D conversion unit 20 may be provided on paths from the receiving coils 6 to the coil ports 13.

Second Embodiment

In the first embodiment, the raw data transmission unit 14 and the raw data receiving unit 19 transmit and receive the pieces of magnetic resonance data through wireless communication. The pieces of magnetic resonance data are digitalized, so that they may be transmitted and received through optical communication. In a second embodiment, a raw data transmission unit and a raw data receiving unit transmit and receive pieces of magnetic resonance data through the optical communication.

The configuration of an MRI apparatus 100a in the second embodiment is the same as the configuration of the MRI apparatus 100 illustrated in FIG. 1 other than a point that partial functions of the raw data transmission unit and the raw data receiving unit are different. A detailed description of the configuration of the MRI apparatus 100a in the second embodiment is therefore omitted.

Figure 13:
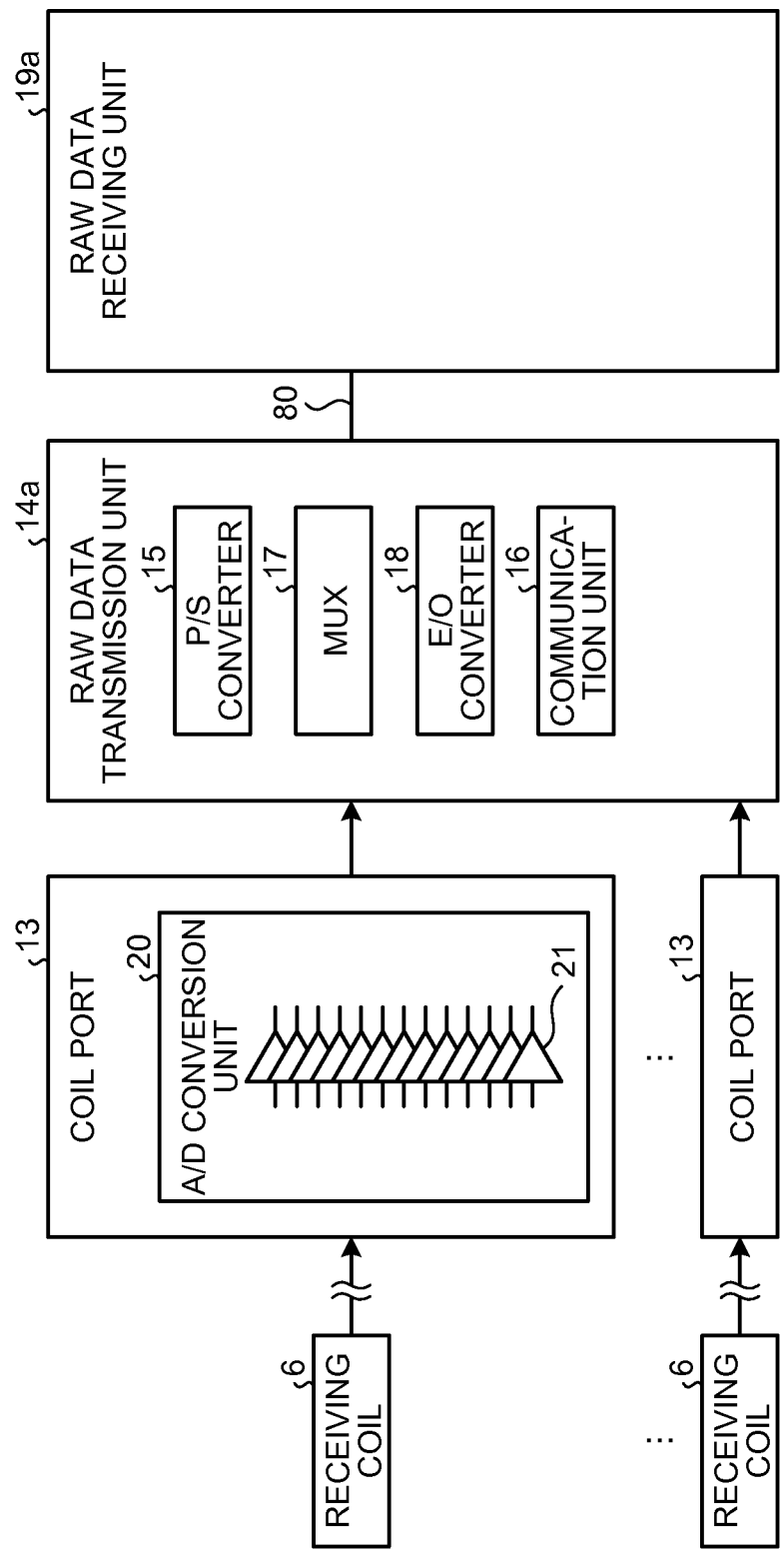
FIG. 13 is a diagram for explaining a raw data transmission unit and a raw data receiving unit according to a second embodiment.

FIG. 13 is a diagram for explaining a raw data transmission unit 14a and a raw data receiving unit 19a in the second embodiment. As illustrated in FIG. 13, the raw data transmission unit 14a and the raw data receiving unit 19a are connected to each other so as to be communicable through an optical cable 80. The raw data transmission unit 14a includes the P/S converter 15, the communication unit 16, a multiplexer (MUX) 17, and an electrical/optical (E/O) converter 18, and transmits pieces of magnetic resonance data for a plurality of channels that have been generated by the A/D conversion units 20 to the data operation unit 60 through the optical communication. It should be noted that the P/S converter 15 and the communication unit 16 have the same functions as those of the P/S converter 15 and the communication unit 16 illustrated in FIG. 3. The P/S converter 15 transmits the pieces of magnetic resonance data converted to the serial signals to the MUX 17.

The MUX 17 multiplexes the pieces of magnetic resonance data converted to the serial signals. To be specific, the MUX 17 multiplexes the pieces of magnetic resonance data for the respective channels that have been transmitted from the P/S converter 15 and transmits the multiplexed pieces of magnetic resonance data to the E/O converter 18.

The E/O converter 18 converts the pieces of magnetic resonance data to optical signals. To be specific, the E/O converter 18 converts the pieces of magnetic resonance data transmitted from the MUX 17 to the optical signals from electric signals and transmits the converted pieces of magnetic resonance data to the raw data receiving unit 19a through the optical cable 80. The raw data receiving unit 19a includes an optical/electrical (O/E) converter (not illustrated), converts the pieces of magnetic resonance data as the optical signals received from the raw data transmission unit 14a to electric signals, and transmits them to the data operation unit 60.

As described above, in the second embodiment, the raw data transmission unit 14a and the raw data receiving unit 19a can transmit and receive the pieces of magnetic resonance data through the optical communication.

Furthermore, as described above, in the second embodiment, the magnetic resonance signals are digitalized in the coil ports 13, so that compatibility with the existing coil is kept. The magnetic resonance signals are digitalized in the couch 4, thereby performing thinning processing of the pieces of magnetic resonance data and bundling processing of the serial signals. These pieces of processing can reduce the number of cables connecting the couch 4 and the raw data receiving unit 19a. With this configuration, a detachable dockable couch capable of moving a patient while he (she) is lying is easy to be configured.

Third Embodiment

In the above-mentioned first embodiment and second embodiment, the data operation unit 60 acquires the pieces of magnetic resonance data from the raw data receiving unit 19 (or the raw data receiving unit 19a) and specifies the pieces of magnetic resonance data to be used for reconstruction by referring to the selection information transmitted from the real time sequencer 50. The data operation unit 60 may be provided between the A/D conversion units 20 and the raw data transmission unit 14. In a third embodiment, an MRI apparatus 100b includes the data operation unit 60 between the A/D conversion units 20 and the raw data transmission unit 14.

Figure 14:
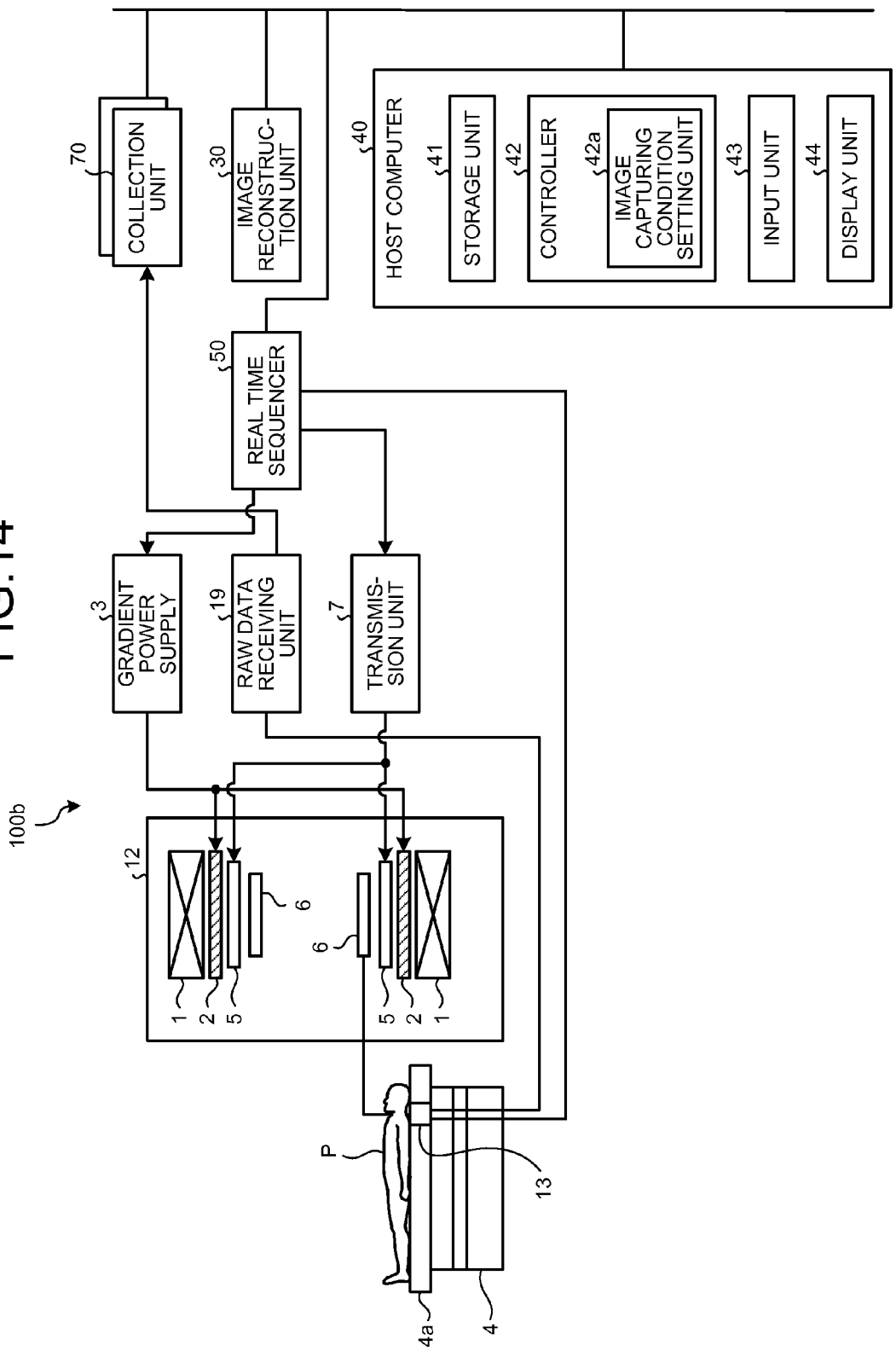
FIG. 14 is a block diagram illustrating an example of the configuration of an MRI apparatus according to a third embodiment.

FIG. 14 is a block diagram illustrating an example of the configuration of the MRI apparatus 100b in the third embodiment. As illustrated in FIG. 14, the MRI apparatus 100b in the third embodiment includes the static magnetic field magnet 1, the gradient coil 2, the gradient power supply 3, the couch 4, the transmission coils 5, the receiving coils 6, the transmission unit 7, the raw data receiving unit 19, the image reconstruction unit 30, the host computer 40, the real time sequencer 50, and the collection unit 70. It should be noted that the same reference numerals denote constituent components having the same functions as those of the respective components illustrated in FIG. 1 and a detailed description thereof is omitted. As illustrated in FIG. 14, the MRI apparatus 100b in the third embodiment does not include the data operation unit 60 between the raw data receiving unit 19 and the collection unit 70.

Figure 15:
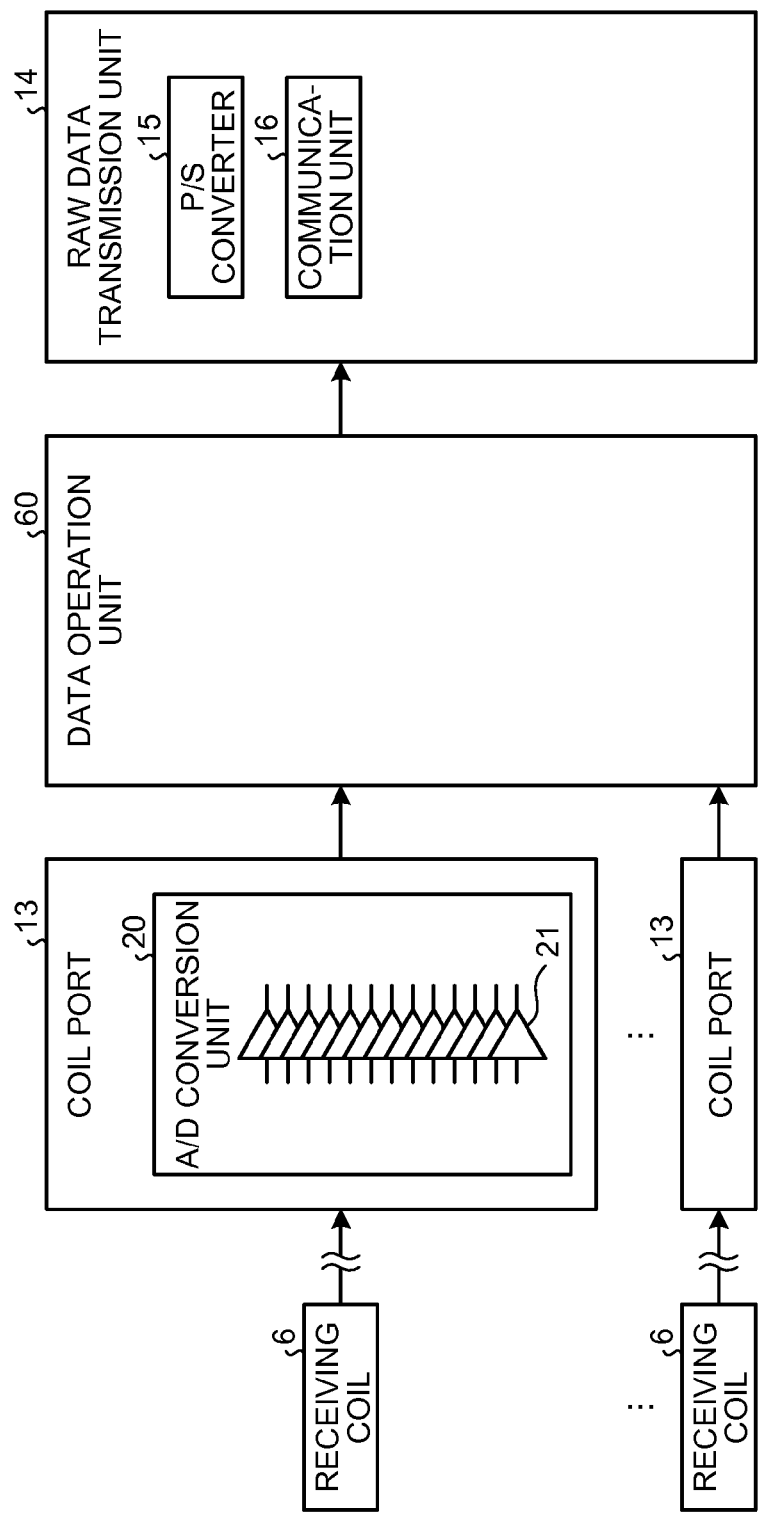
FIG. 15 is a diagram for explaining a data operation unit in the third embodiment.

FIG. 15 is a diagram for explaining the data operation unit 60 in the third embodiment. As illustrated in FIG. 15, the data operation unit 60 in the third embodiment is connected to each of the coil ports 13 and the raw data transmission unit 14. The data operation unit 60 in the third embodiment is connected to the real time sequencer 50 (not illustrated in FIG. 15).

The data operation unit 60 in the third embodiment receives the pieces of magnetic resonance data from the respective coil ports 13 and selects the pieces of magnetic resonance data to be used for reconstruction by referring to the selection information transmitted from the real time sequencer 50. The data operation unit 60 in the third embodiment then transmits the selected pieces of magnetic resonance data to the raw data transmission unit 14. As a result, the raw data transmission unit 14 transmits the pieces of magnetic resonance data for the channels that have been generated by the A/D conversion units 20 to the collection unit 70 through wireless communication or optical communication. For example, the raw data transmission unit 14 converts the pieces of magnetic resonance data from parallel signals to serial signals, and transmits the pieces of magnetic resonance data converted to the serial signals to the raw data receiving unit 19. The raw data receiving unit 19 transmits the received pieces of magnetic resonance data to the collection unit 70. With this, the image reconstruction unit 30 performs pieces of image processing such as filtering processing and reconstruction processing on the pieces of magnetic resonance data transmitted from the collection unit 70 so as to generate image data.

As described above, in the third embodiment, the communication load between the raw data transmission unit 14 and the raw data receiving unit 19 can be reduced by selecting the pieces of magnetic resonance data that are transmitted by the raw data transmission unit 14.

Although the raw data transmission unit 14 and the raw data receiving unit 19 transmit and receive the pieces of magnetic resonance data through the wireless communication in the third embodiment, the embodiment is not limited thereto. For example, the raw data transmission unit and the raw data receiving unit may transmit and receive pieces of magnetic resonance data through the optical communication.

Other Embodiments

Although the data operation unit 60 has the buffer in the above-mentioned embodiments, the embodiment is not limited thereto. For example, the data operation unit 60 may not have the buffer. In such a case, the data operation unit 60, for example, generates order information in which the channels and addresses of storage regions of the collection unit 70 are made to correspond to each other by referring to the selection information transmitted from the real time sequencer 50. The data operation unit 60 makes the channels and the storage regions of the collection unit 70 correspond to each other so as to generate image data in the order of slice positions. The data operation unit 60 then stores the respective pieces of magnetic resonance data generated by the A/D conversion units 20 in the storage regions of the collection unit 70 at address positions corresponding to the channels of the respective pieces of magnetic resonance data by referring to the order information. It should be noted that the data operation unit 60 may acquire order information generated by the real time sequencer 50, for example, without generating the order information.

Although the A/D conversion units 20 transmit all the pieces of magnetic resonance data to the raw data transmission unit 14 without selecting the pieces of magnetic resonance data generated from all the coil elements included in the receiving coils 6 in the above-mentioned embodiments, the embodiment is not limited thereto. For example, the A/D conversion units 20 may convert only the magnetic resonance signals transmitted from previously specified coil elements among all the coil elements included in the receiving coils 6 to digital signals, generate pieces of magnetic resonance data, and transmit all the pieces of magnetic resonance data to the raw data transmission unit 14 without selecting the generated pieces of magnetic resonance data. To be more specific, when the number of coil elements included in the receiving coils 6 is 128 and the number of previously specified coil elements is 120, the A/D conversion units 20 generate the pieces of magnetic resonance data for the 120 coil elements and transmit the generated pieces of magnetic resonance data to the raw data transmission unit 14. The data operation unit 60 then acquires the pieces of magnetic resonance data for the 120 coil elements that have been generated by the A/D conversion units 20 through the raw data receiving unit 19. Also in this case, the data operation unit 60 selects pieces of magnetic resonance data to be used for reconstruction among the pieces of magnetic resonance data for the 120 coil elements by referring to the selection information transmitted from the real time sequencer 50, and transmits the selected pieces of magnetic resonance data to the collection unit 70.

Although one raw data transmission unit 14 (or the raw data transmission unit 14a) is provided in the above-mentioned embodiments, the embodiment is not limited thereto. For example, the raw data transmission unit 14 (or the raw data transmission unit 14a) may be provided independently for each coil port 13. That is to say, the raw data transmission units 14 (or the raw data transmission units 14a) are connected to the respective coil ports 13 in a one-to-one relation. In this case, the respective raw data transmission units 14 (or the raw data transmission units 14a) transmit the pieces of magnetic resonance data that are transmitted from the respective A/D conversion units 20 connected thereto to the raw data receiving unit 19 (or raw data receiving unit 19a).

Although the raw data transmission unit 14 includes the P/S converter 15 and the communication unit 16 in the above-mentioned embodiments, the embodiment is not limited thereto. For example, the raw data transmission unit 14 may further include the multiplexer 17 in addition to the P/S converter 15 and the communication unit 16.

At least one of the embodiments as described above can prevent noise from being mixed into the magnetic resonance signals with a simple apparatus configuration.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
a plurality of receiving coils that receives magnetic resonance signals emitted from a subject;
a couch including coil ports connected to the respective receiving coils;
conversion units, each of which is arranged within or on a respective one of the coil ports included in the couch, which convert magnetic resonance signals output from the receiving coils to digital signals so as to generate pieces of magnetic resonance data;
a selection unit that selects, from pieces of magnetic resonance data output for respective channels from the receiving coils and converted to digital signals by the conversion units, pieces of magnetic resonance data to be used for reconstruction; and
a reconstruction unit that reconstructs image data using the pieces of magnetic resonance data selected by the selection unit.

2. The magnetic resonance imaging apparatus according to claim 1, wherein the selection unit includes a buffer that accumulates the pieces of magnetic resonance data for channels and selects the pieces of magnetic resonance data to be used for reconstruction of images from the pieces of magnetic resonance data that are accumulated in the buffer.

3. The magnetic resonance imaging apparatus according to claim 2, wherein the selection unit rearranges the pieces of magnetic resonance data to be used for reconstruction in the order of slices in the buffer.

4. The magnetic resonance imaging apparatus according to claim 1, further comprising a specifying unit that specifies the pieces of magnetic resonance data to be used for reconstruction based on an image capturing condition received from an operator, wherein
the selection unit selects the pieces of magnetic resonance data specified by the specifying unit as the pieces of magnetic resonance data to be used for reconstruction.

5. The magnetic resonance imaging apparatus according to claim 2, further comprising a specifying unit that specifies the pieces of magnetic resonance data to be used for reconstruction based on an image capturing condition received from an operator, wherein
the selection unit selects the pieces of magnetic resonance data specified by the specifying unit as the pieces of magnetic resonance data to be used for reconstruction.

6. The magnetic resonance imaging apparatus according to claim 3, further comprising a specifying unit that specifies the pieces of magnetic resonance data to be used for reconstruction based on an image capturing condition received from an operator, wherein
the selection unit selects the pieces of magnetic resonance data specified by the specifying unit as the pieces of magnetic resonance data to be used for reconstruction.

7. The magnetic resonance imaging apparatus according to claim 1, further comprising a receiver that receives a direction on the pieces of magnetic resonance data to be used for reconstruction from an operator, wherein
the selection unit selects the pieces of magnetic resonance data received by the receiver as the pieces of magnetic resonance data to be used for reconstruction.

8. The magnetic resonance imaging apparatus according to claim 2, further comprising a receiver that receives a direction on the pieces of magnetic resonance data to be used for reconstruction from an operator, wherein
the selection unit selects the pieces of magnetic resonance data received by the receiver as the pieces of magnetic resonance data to be used for reconstruction.

9. The magnetic resonance imaging apparatus according to claim 3, further comprising a receiver that receives a direction on the pieces of magnetic resonance data to be used for reconstruction from an operator, wherein
the selection unit selects the pieces of magnetic resonance data received by the receiver as the pieces of magnetic resonance data to be used for reconstruction.

10. The magnetic resonance imaging apparatus according to claim 1, further comprising a transmitter that transmits the pieces of magnetic resonance data that have been generated by the conversion units to the selection unit through wireless communication or optical communication, wherein
the selection unit selects pieces of magnetic resonance data to be used for reconstruction from among the pieces of magnetic resonance data transmitted by the transmitter.

11. The magnetic resonance imaging apparatus according to claim 2, further comprising a transmitter that transmits the pieces of magnetic resonance data generated by the conversion units to the selection unit through wireless communication or optical communication, wherein
the selection unit selects pieces of magnetic resonance data to be used for reconstruction from among the pieces of magnetic resonance data transmitted by the transmitter.

12. The magnetic resonance imaging apparatus according to claim 3, further comprising a transmitter that transmits the pieces of magnetic resonance data generated by the conversion units to the selection unit through wireless communication or optical communication, wherein
the selection unit selects pieces of magnetic resonance data to be used for reconstruction from among the pieces of magnetic resonance data transmitted by the transmitter.

13. The magnetic resonance imaging apparatus according to claim 1, further comprising:
a collection unit that collects the pieces of magnetic resonance data to be used for reconstruction; and
a transmitter that transmits the pieces of magnetic resonance data generated by the conversion units to the collection unit through wireless communication or optical communication, wherein
the selection unit selects pieces of magnetic resonance data to be used for reconstruction from among the pieces of magnetic resonance data generated by the conversion units, and delivers the selected pieces of magnetic resonance data to the transmitter.

14. The magnetic resonance imaging apparatus according to claim 2, further comprising:
a collection unit that collects the pieces of magnetic resonance data to be used for reconstruction; and
a transmitter that transmits the pieces of magnetic resonance data generated by the conversion units to the collection unit through wireless communication or optical communication, wherein
the selection unit selects pieces of magnetic resonance data to be used for reconstruction from among the pieces of magnetic resonance data generated by the conversion units, and delivers the selected pieces of magnetic resonance data to the transmitter.

15. The magnetic resonance imaging apparatus according to claim 3, further comprising:
a collection unit that collects the pieces of magnetic resonance data to be used for reconstruction; and a transmitter that transmits the pieces of magnetic resonance data generated by the conversion units to the collection unit through wireless communication or optical communication, wherein the selection unit selects pieces of magnetic resonance data to be used for reconstruction from among the pieces of magnetic resonance data generated by the conversion units, and delivers the selected pieces of magnetic resonance data to the transmitter.

16. A magnetic resonance imaging apparatus comprising:

a plurality of receiving coils that receives magnetic resonance signals that are emitted from a subject;

a couch including coil ports that are connected to the respective receiving coils;

conversion units, each of which is arranged within or on a respective one of the coil ports included in the couch, which convert magnetic resonance signals that are output from the receiving coils to digital signals so as to generate pieces of magnetic resonance data; and a reconstruction unit that reconstructs image data using the pieces of magnetic resonance data.

\* \* \* \* \*